(12) United States Patent
I-Chang

(10) Patent No.: US 7,235,466 B2
(45) Date of Patent: *Jun. 26, 2007

(54) METHOD OF FABRICATING A POLYSILICON LAYER

(75) Inventor: Tsao I-Chang, Hsinchu (TW)

(73) Assignee: Au Optronics Corporation, Hsinchu (TW)

(*) Notice: Subject to any disclaimer, the term of this patent is extended or adjusted under 35 U.S.C. 154(b) by 68 days.

This patent is subject to a terminal disclaimer.

(21) Appl. No.: 10/906,007

(22) Filed: Jan. 31, 2005

(65) Prior Publication Data

US 2005/0106841 A1 May 19, 2005

Related U.S. Application Data

(63) Continuation-in-part of application No. 10/248,372, filed on Jan. 15, 2003, now Pat. No. 6,867,074.

(30) Foreign Application Priority Data

Oct. 31, 2002 (TW) .............................. 91132242 A

(51) Int. Cl.
*H01L 21/20* (2006.01)
(52) U.S. Cl. .................. 438/487; 438/479; 438/482; 438/486; 438/488
(58) Field of Classification Search ................ 438/479, 438/482, 486–488
See application file for complete search history.

(56) References Cited

U.S. PATENT DOCUMENTS

| 5,970,367 A * | 10/1999 | Wanlass ..................... 438/479 |
| 6,410,368 B1 * | 6/2002 | Kawasaki et al. .......... 438/145 |
| 6,558,989 B1 * | 5/2003 | Moon .......................... 438/151 |
| 6,867,074 B2 * | 3/2005 | Tsao ............................ 438/149 |
| 6,933,527 B2 * | 8/2005 | Isobe et al. ................... 257/59 |
| 2002/0192956 A1 * | 12/2002 | Kizilyalli et al. ........... 438/689 |
| 2003/0218169 A1 * | 11/2003 | Isobe et al. ................... 257/59 |
| 2004/0087135 A1 * | 5/2004 | Canaperi et al. ............ 438/628 |
| 2004/0155352 A1 * | 8/2004 | Ma ............................. 257/758 |

* cited by examiner

*Primary Examiner*—Zandra V. Smith
*Assistant Examiner*—Bac H. Au
(74) *Attorney, Agent, or Firm*—Jiang Chyun IP Office

(57) ABSTRACT

A method of fabrication a polysilicon layer is provided. A substrate is provided and then a buffer layer having a plurality of trenches thereon is formed over the substrate. Thereafter, an amorphous silicon layer is formed over the buffer layer. Finally, a laser annealing process is conducted so that the amorphous silicon layer melts and crystallizes into a polysilicon layer starting from the upper reach of the trenches. This invention can be applied to fabricate the polysilicon layer of a low temperature polysilicon thin film transistor liquid crystal display such that the crystals inside the polysilicon layer are uniformly distributed and have a larger average size.

10 Claims, 13 Drawing Sheets

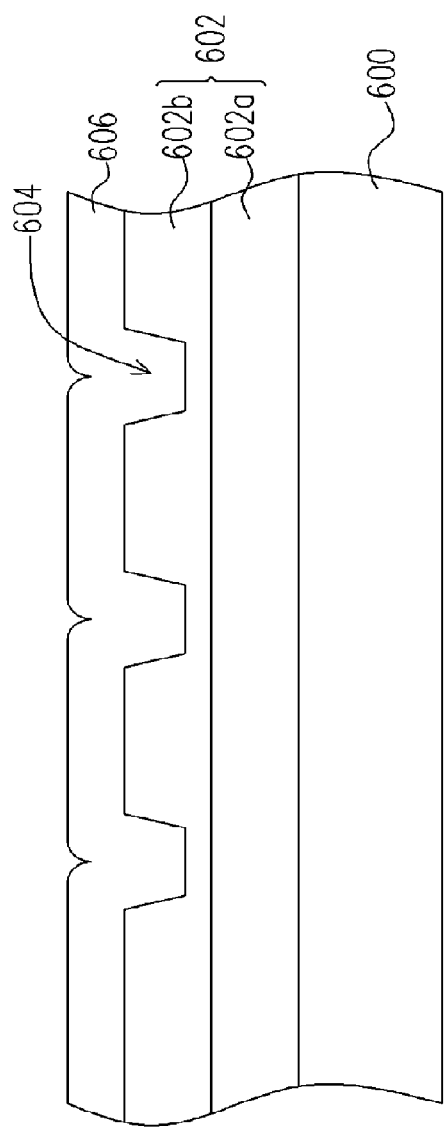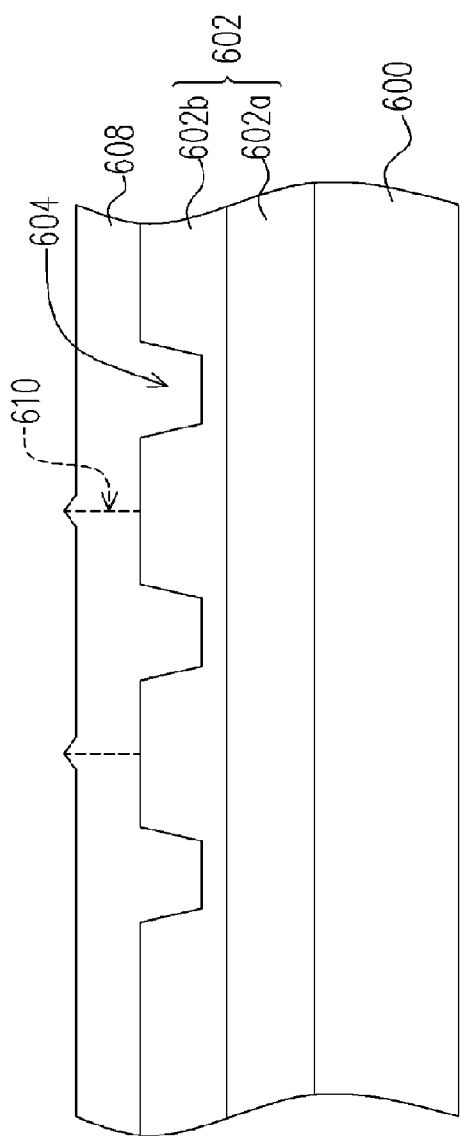
FIG. 6C
FIG. 6D

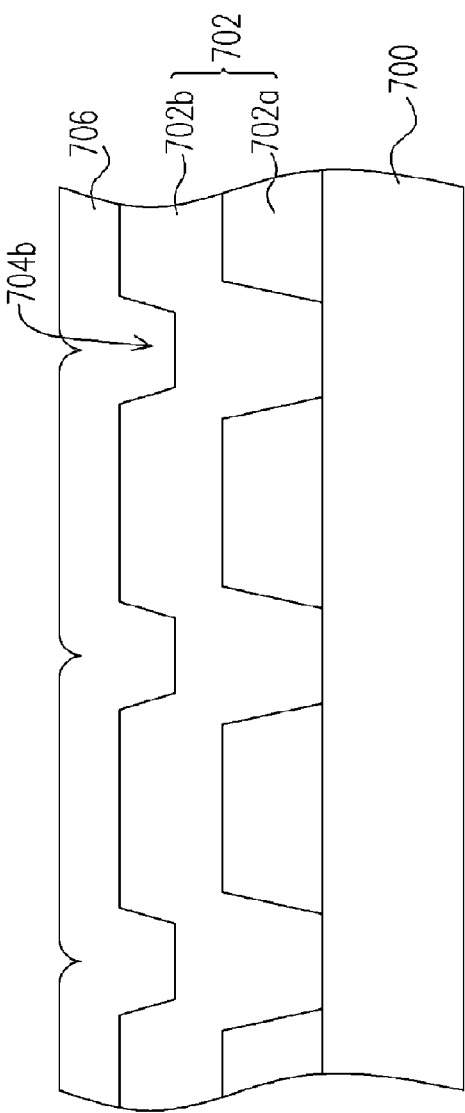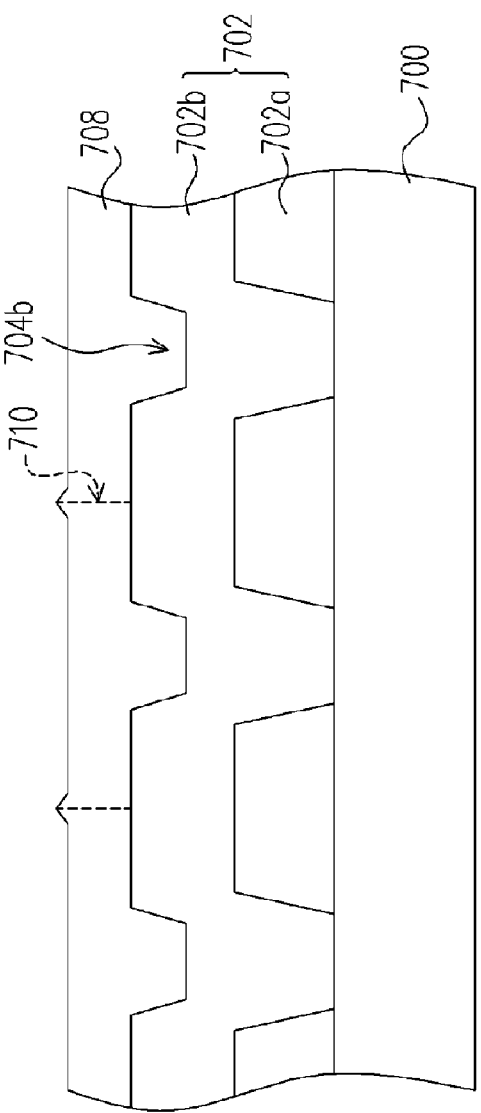

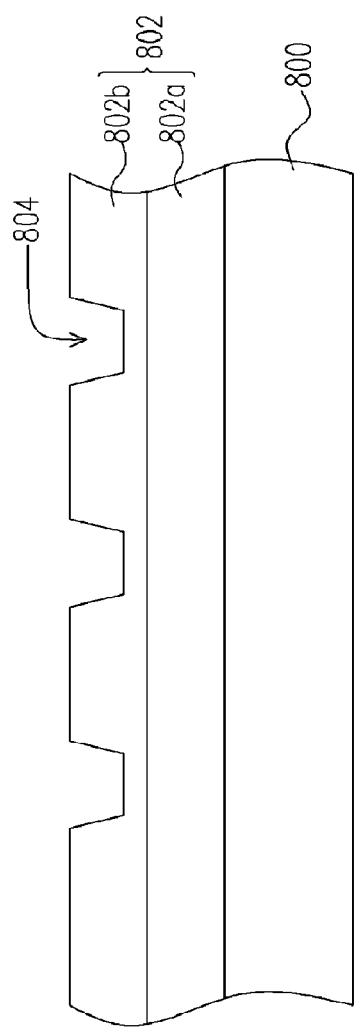
FIG. 8B'
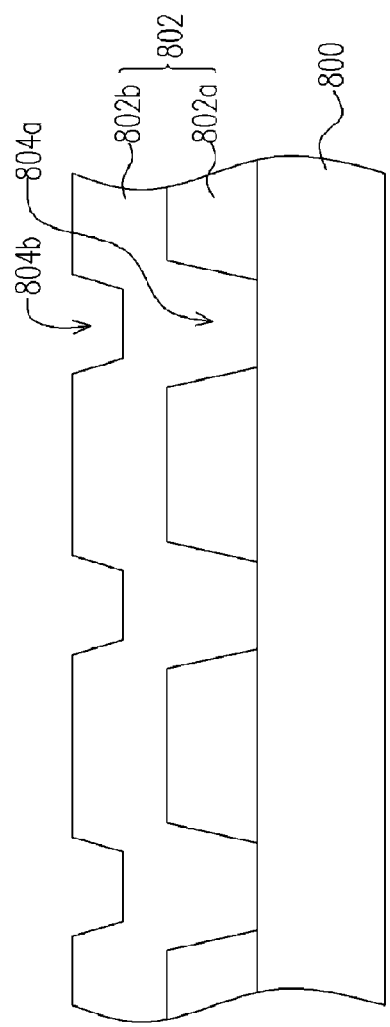
FIG. 8B"

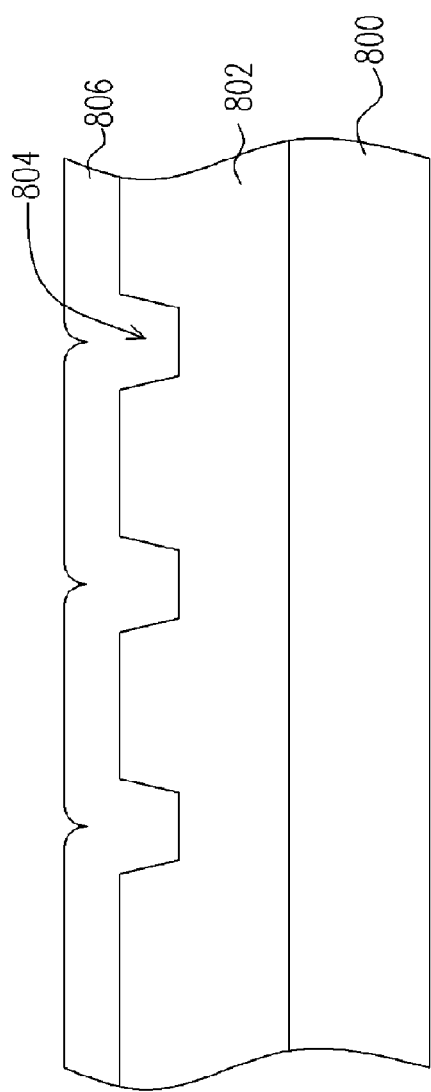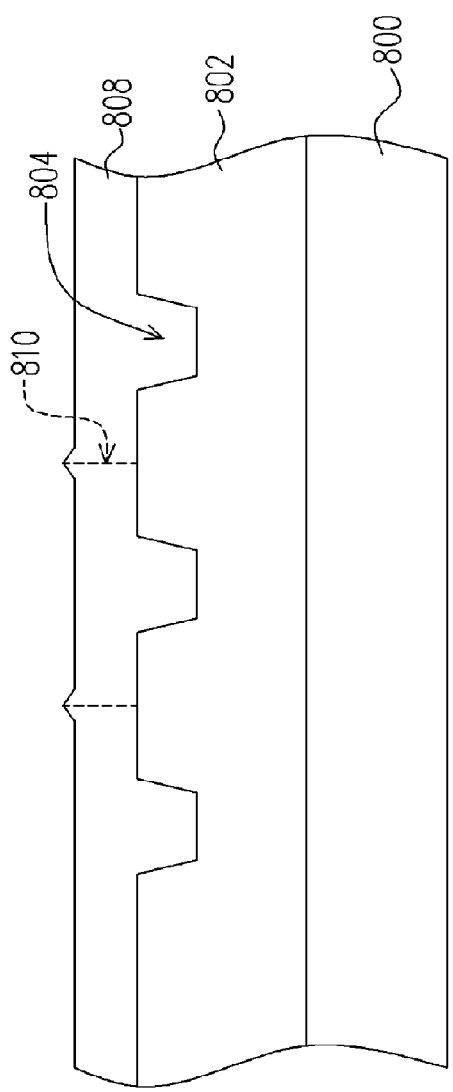

METHOD OF FABRICATING A POLYSILICON LAYER

CROSS-REFERENCE TO RELATED APPLICATION

This application is a continuation-in-part of a prior application Ser. No. 10/248,372, filed Jan. 15, 2003, now U.S. Pat. No. 6,867,074 which claims the priority benefit of Taiwan application serial no. 91132242, filed Oct. 31, 2002.

BACKGROUND OF THE INVENTION

1. Field of Invention

The present invention relates to a method of fabricating a polysilicon layer. More particularly, the present invention relates to a method of fabricating a polysilicon layer through lateral crystallization using partially melted amorphous silicon inside a trench as nucleation seeds.

2. Description of Related Art

Low temperature polysilicon thin film transistor liquid crystal display (LTPS TFT-LCD) differs from a conventional amorphous silicon thin film transistor liquid crystal display ($\alpha$-Si TFT-LCD) in that electron mobility as high as 200 $cm^2$/V-sec can be reached. Hence, each thin film transistor device may occupy a smaller area so that a higher opening rate and hence a brighter display with smaller power consumption can be obtained. In addition, an increase in electron mobility also opens up the possibility of fabricating a portion of the driver circuit and the thin film transistor together on a glass substrate. Ultimately, reliability of the liquid crystal display panel is improved and cost of producing each display is reduced. Therefore, LTPS TFT-LCD has a fabrication cost considerably lower than $\alpha$-Si TFT-LCD. Other advantages of the LTPS TFT-LCD has includes a slim package, a light body and a relatively high resolution. These advantages render the LTPS TFT-LCD especially suitable for implementing on portable and energy-short mobile terminal products.

The channel layer of the thin film transistor inside a LTPS TFT-LCD is formed in an excimer laser annealing (ELA) process. In general, quality of the channel layer depends largely on the average size of the polysilicon grains and their uniformity. However, the average size of the polysilicon grains and their uniformity are directly related to the energy provided to the excimer laser in the annealing process.

FIGS. 1A to 1C are schematic cross-sectional views showing the steps for producing a conventional polysilicon layer. As shown in FIG. 1A, a substrate 100 such as a glass substrate is provided. A buffer layer 102 is formed over the substrate 100. In general, the buffer layer 102 is a composite layer that includes a silicon nitride layer or a silicon oxide layer.

As shown in FIGS. 1B and 1C, an amorphous silicon layer 104 is formed over the buffer layer 102. Thereafter, an excimer laser annealing (ELA) process is conducted. The amount of radiation energy on the amorphous silicon layer 104 provided by the excimer laser is so carefully controlled that the entire amorphous silicon layer 104 almost completely melts. Hence, only a few seed of crystallization remains on top of the buffer layer 102. Thereafter, the melted silicon will start to crystallize from the seeds of crystallization to form a polysilicon layer 106 that contains lots of non-uniformly distributed grain boundaries.

In the aforementioned excimer laser annealing process, if the energy provided to the excimer laser exceeds the super lateral growth (SLG) point, density distribution of the seed of crystallization may drop to a very low value within a transient interval. The sudden loss of seed of crystallization may lead to the production of lots of small and highly non-uniform grains. Thus, energy to the excimer laser must be precisely controlled in order to fabricate a polysilicon layer with large and uniform grains therein. In other words, the process window is very small.

FIG. 2 is a perspective view showing a buffer layer with lots of openings capable of facilitating the fabrication of a polysilicon layer over the buffer layer. As shown in FIG. 2, a substrate 200 such as a glass substrate is provided. A buffer layer 202 is formed over the substrate 200. In general, the buffer layer 202 is a composite layer that includes a silicon nitride layer and a silicon oxide layer. To increase the grain size and uniformity of the polysilicon layer and widen the process window of the fabrication process, a plurality of openings arranged into an array is formed on the buffer layer 202. These openings 204 play a significant role during the excimer laser annealing process. During the annealing process, the amorphous silicon (not shown) outside the openings 204 melts completely and the silicon turns into a liquid state. However, some amorphous silicon (not shown) at the bottom of the openings 204 may remain solid and act as initiation sites for the lateral growth of crystal to form a polysilicon layer. In other words, crystallization starts out from the openings 204. Consequently, the quantity and distribution of the seed of crystallization is precisely controlled.

FIG. 3 is a top view showing the grain boundaries of a polysilicon layer formed with an array of openings on the buffer layer as shown in FIG. 2. Since the amorphous silicon at the bottom of the openings 204 does not melt completely, crystallization of liquid silicon grows laterally from the bottom of each opening 204. Due to the lateral growth of crystal from the bottom of the openings 204, a grain boundary 300 is formed between neighboring openings 204. In general, locations of the grain boundaries are directly related to the distance of separation between the openings. Because the openings 204 have an array arrangement, grain growth in the x and the y direction is influenced by the separation of neighboring openings. Thus, although the formation of an array of openings in the buffer layer is able to control grain size and uniformity, size of grains is still subjected to an intrinsic restriction.

SUMMARY OF THE INVENTION

Accordingly, one object of the present invention is to provide a method of fabricating a polysilicon layer with a uniform distribution of larger size crystals.

A second object of this invention is to provide a method of fabricating a polysilicon layer capable of increasing the processing window of an excimer laser annealing process.

A third object of this invention is to provide a method of fabricating a polysilicon layer such that the polysilicon layer has fewer grain boundaries.

To achieve these and other advantages and in accordance with the purpose of the invention, as embodied and broadly described herein, the invention provides a method of fabrication a polysilicon layer. The method includes: providing a substrate; forming a buffer layer having a plurality of first trenches over the substrate; forming an amorphous silicon layer over the buffer layer; and, conducting a laser annealing process so that the amorphous silicon layer melts and crystallizes into a polysilicon layer starting from the upper reach of the first trenches.

In this invention, the steps for forming the buffer layer with first trenches thereon over the substrate includes: forming a silicon nitride layer over the substrate; forming a plurality of second trenches within the silicon nitride layer; and, forming a conformal silicon oxide layer over the silicon nitride layer so that a plurality of first trenches are formed in the silicon oxide layer corresponding in position to the respective second trenches.

Alternative, the steps for forming the buffer layer with first trenches thereon over the substrate includes: forming a silicon nitride layer over the substrate; forming a silicon oxide layer over the silicon nitride layer; and, forming a plurality of first trenches in the silicon oxide layer.

In this invention, photolithographic/etching processes, for example, are used to form the first trenches and/or the second trenches. The laser annealing process includes an excimer laser annealing process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 6A to 6D are schematic cross-sectional view showing the progression of steps for fabricating a polysilicon layer according to one preferred embodiment of this invention.

FIGS. 7A to 7D are schematic cross-sectional view showing the progression of steps for fabricating a polysilicon layer according to a second preferred embodiment of this invention.

FIGS. 8A to 8D are schematic cross-sectional view showing the progression of steps for fabricating a polysilicon layer according to a third preferred embodiment of this invention.

FIGS. 8B' and 8B" are schematic cross-sectional view showing the alternative steps of FIG. 8B according to this invention.

DESCRIPTION OF THE PREFERRED EMBODIMENTS

Figure 1A:
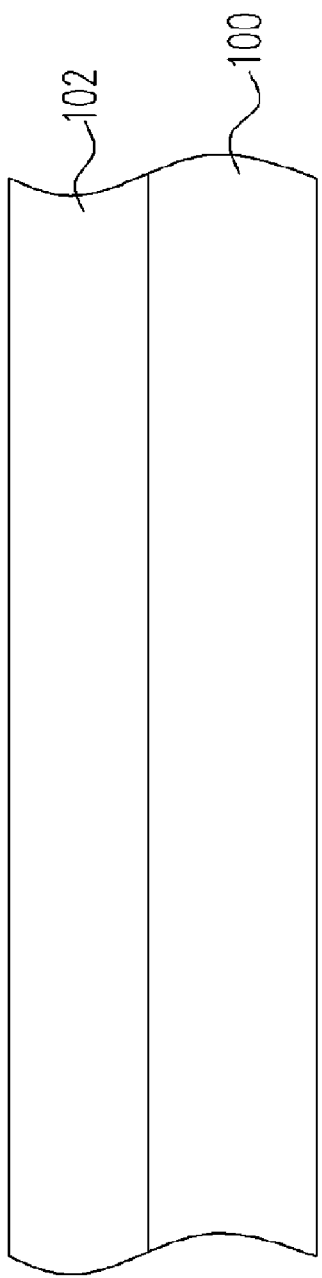
FIGS. 1A to 1C are schematic cross-sectional views showing the steps for producing a conventional polysilicon layer.
Figure 1B:
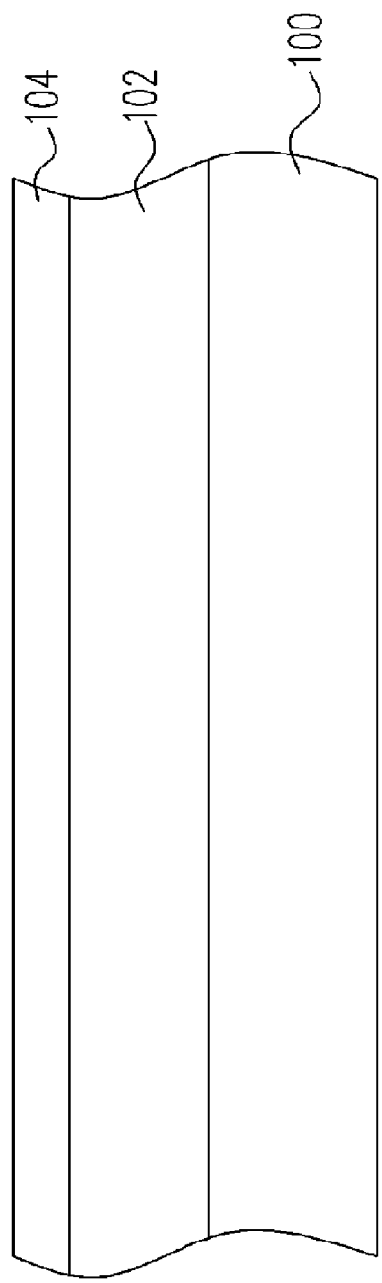
Figure 1C:
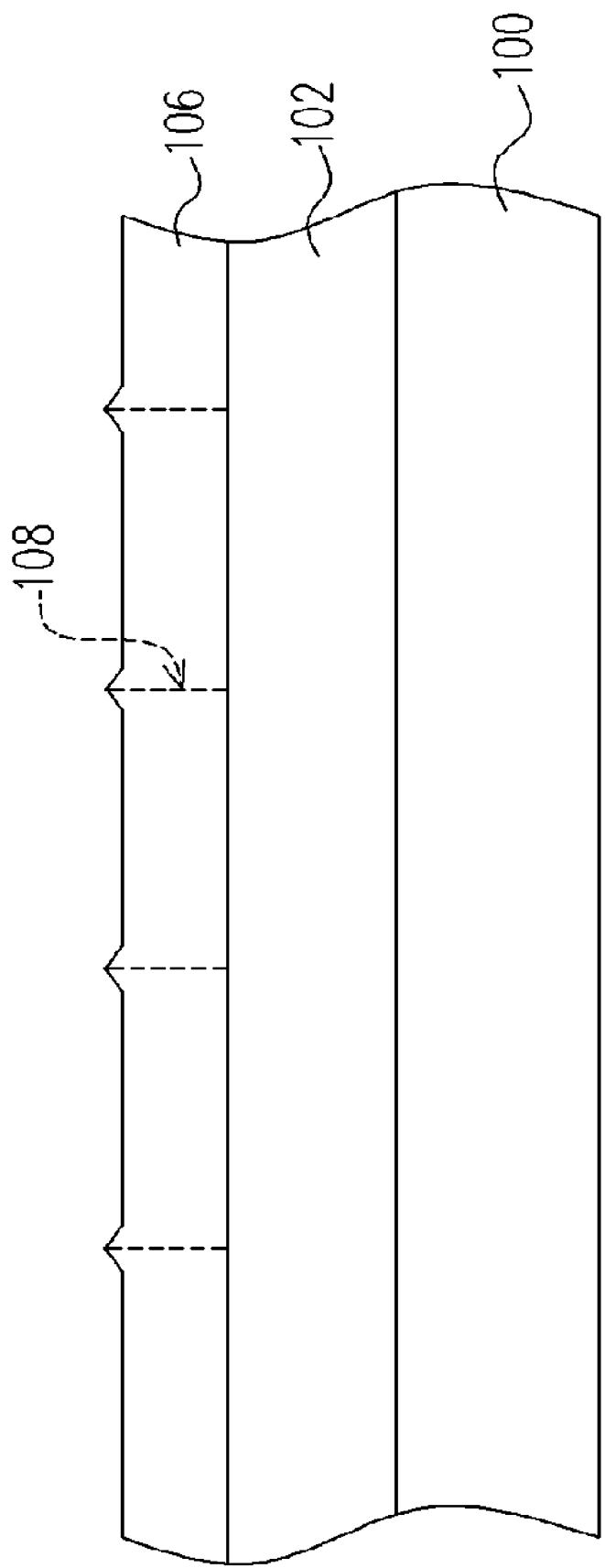
Figure 2:
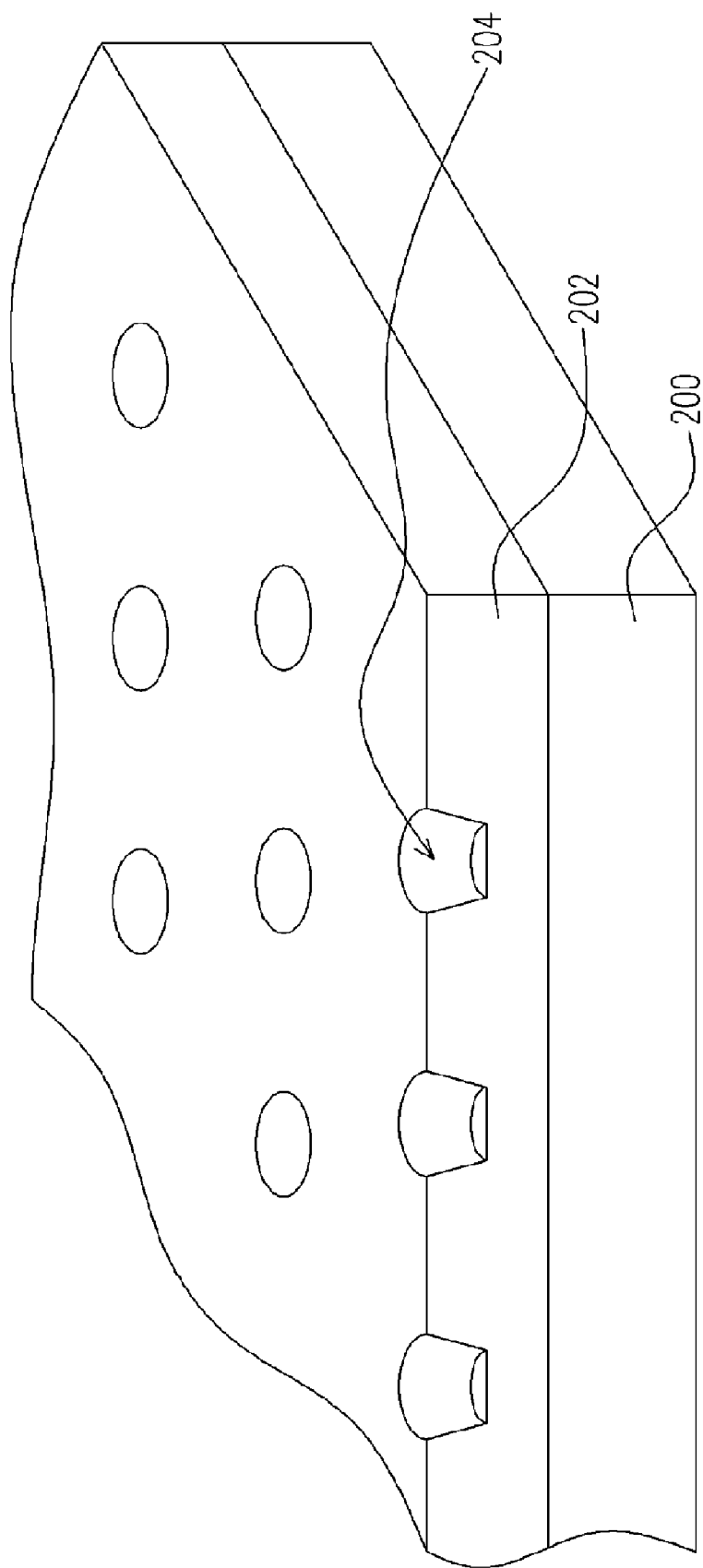
FIG. 2 is a perspective view showing a buffer layer with lots of openings capable of facilitating the fabrication of a polysilicon layer over the buffer layer.
Figure 3:
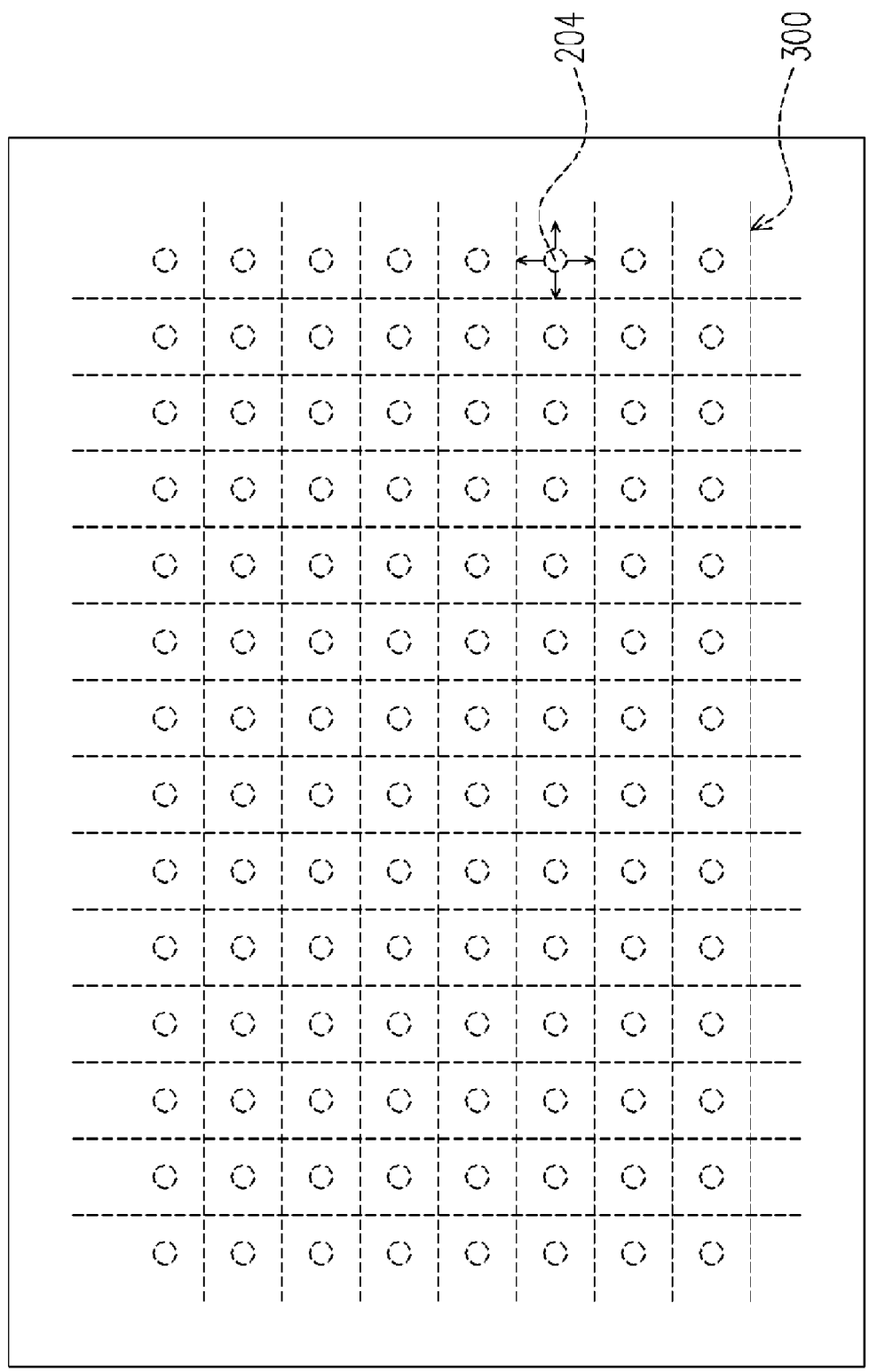
FIG. 3 is a top view showing the grain boundaries of a polysilicon layer formed with an array of openings on the buffer layer as shown in FIG. 2.

Reference will now be made in detail to the present preferred embodiments of the invention, examples of which are illustrated in the accompanying drawings. Wherever possible, the same reference numbers are used in the drawings and the description to refer to the same or like parts.

Figure 4:
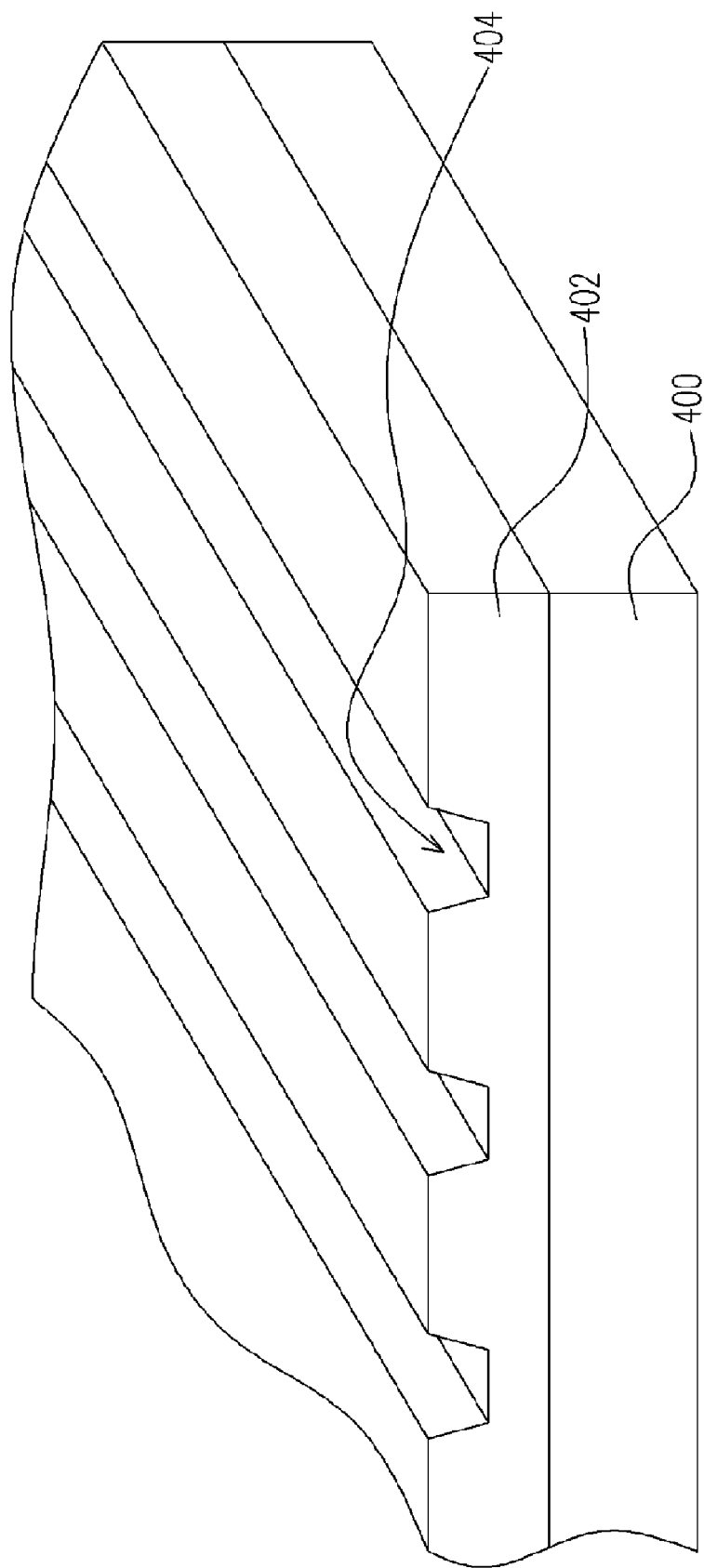
FIG. 4 is a perspective view showing trenches on a buffer layer for fabricating a polysilicon layer according to one preferred embodiment of this invention.

FIG. 4 is a perspective view showing trenches on a buffer layer for fabricating a polysilicon layer according to one preferred embodiment of this invention. As shown in FIG. 4, a substrate 400 such as a glass panel is provided. Thereafter, a buffer layer 402 is formed over the substrate 400. The buffer layer 402 can be, for example, a composite layer that includes a silicon nitride layer and a silicon oxide layer or at least a low-k material layer. To improve crystal size and distribution within a polysilicon layer and increase process window, this embodiment produces a plurality of parallel trenches 404 in the buffer layer 402. The trenches 404 serve as seeds supplier of crystallization in an excimer laser annealing process. During excimer laser annealing, an amorphous silicon layer (not shown) on the buffer layer 402 outside the trench region melts completely while the amorphous silicon at the bottom of the trenches 404 melts only partially. Hence, silicon in the liquid state may start to solidify (lateral crystallization) into a polysilicon layer starting from the bottom of the trenches 404. Since crystallization starts out from the trenches 404, crystal growth can be manipulated through the distribution of seeds of crystallization.

Figure 5:
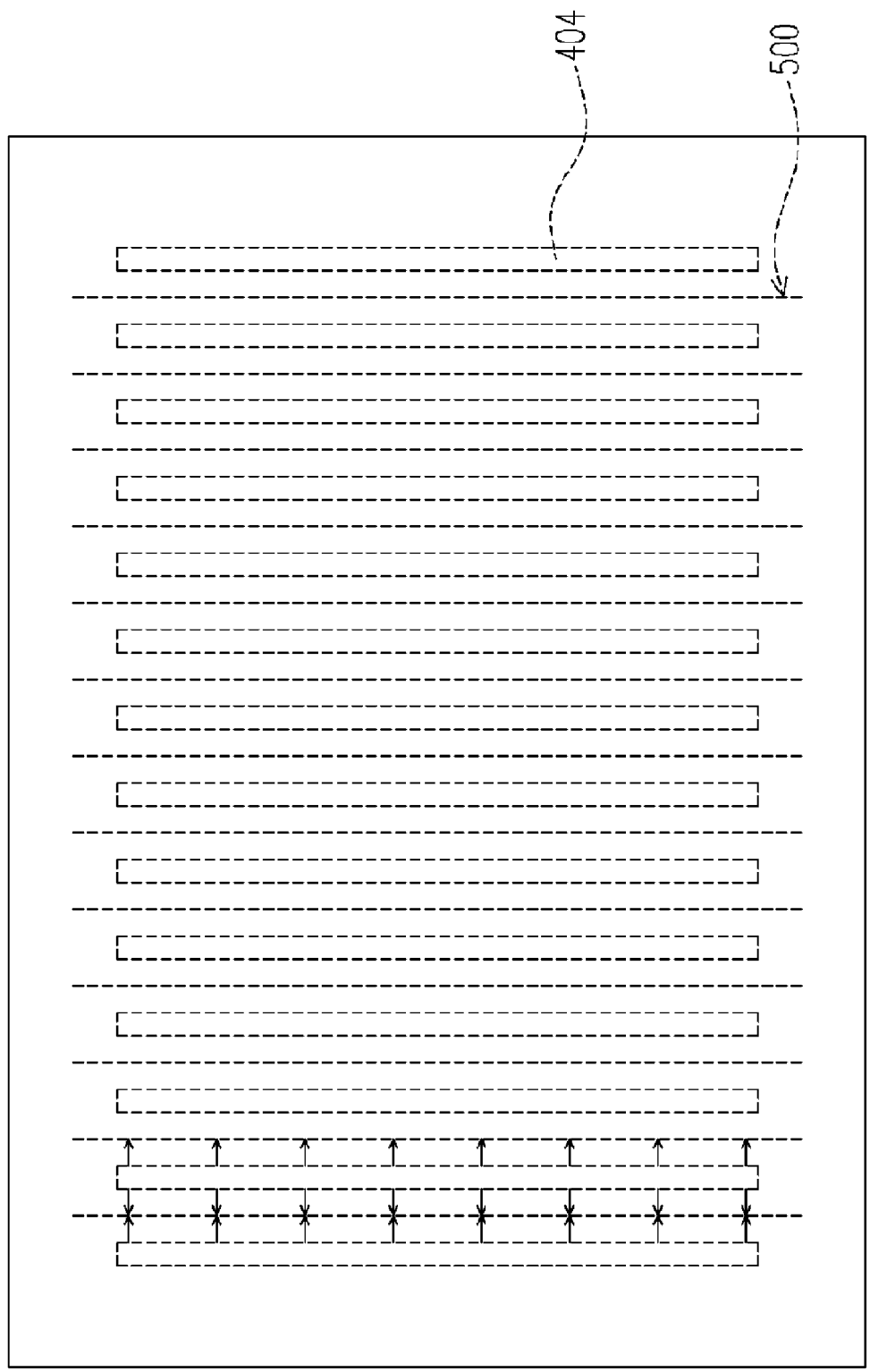
FIG. 5 is a top view showing the crystal boundaries of a polysilicon layer formed over the buffer layer as shown in FIG. 4.

FIG. 5 is a top view showing the crystal boundaries of a polysilicon layer 501 formed over the buffer layer as shown in FIG. 4. As shown in FIG. 5, since the amorphous silicon at the bottom of the trenches 404 melts partially, liquid silicon will crystallize outward from the bottom of the trenches 404. The lateral crystallization of melted silicon crystallizes from the trenches 404 results in the formation of a grain boundary 500 between neighboring trenches 404. Locations of the grain boundaries 500 depend largely on the distance of separation between neighboring trenches 404. Because all the trenches 404 are parallel to each other and runs in a y direction, crystal growth is subjected to limitation in the x direction only. In other words, with the parallel trenches 404 serving as longitudinal seeds of crystallization, crystal size and uniformity of crystal distribution within a polysilicon layer are improved. In the following, the steps for fabricating a polysilicon layer are described in more detail.

Figure 6A:
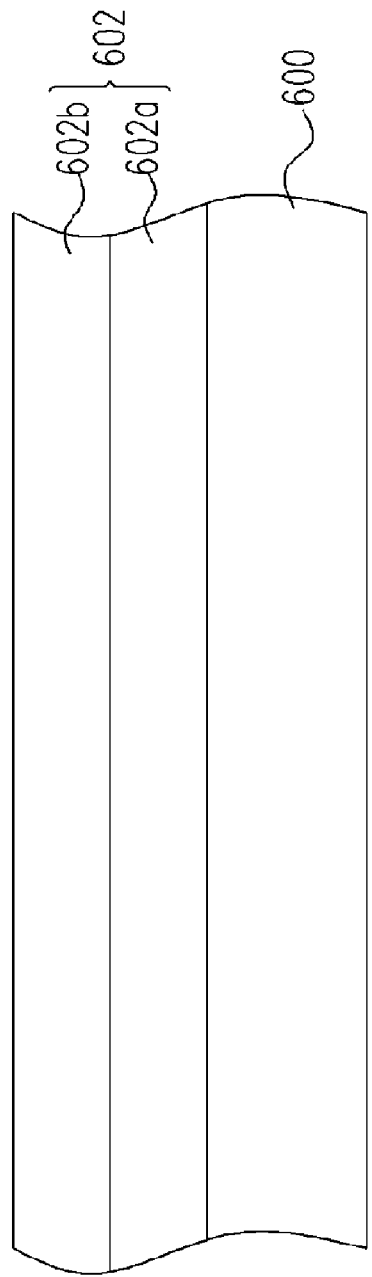

FIGS. 6A to 6D are schematic cross-sectional view showing the progression of steps for fabricating a polysilicon layer according to a first preferred embodiment of this invention. As shown in FIG. 6A, a substrate 600 such as a glass panel is provided. Thereafter, a buffer layer 602 is formed over the substrate 600. The buffer layer can be, for example, a composite layer that includes a silicon nitride layer 602a and a silicon oxide layer 602b. The silicon nitride layer 602a and the silicon oxide layer 602b are formed, for example, in a plasma enhanced chemical vapor deposition (PECVD).

Figure 6B:
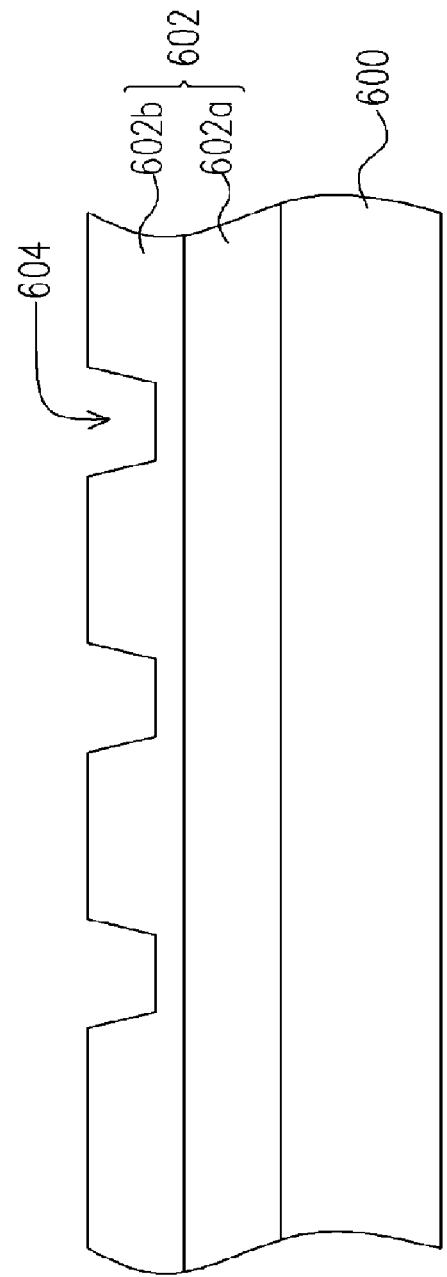

As shown in FIG. 6B, a plurality of parallel trenches 604 is formed on the buffer layer 602. The trenches 604 are formed on the upper silicon oxide layer 602b, for example, by conducting photolithographic and etching processes.

As shown in FIGS. 6C and 6D, an amorphous silicon layer 606 is formed over the buffer layer 602. The amorphous silicon layer 606 is formed, for example, in a low-pressure chemical vapor deposition (LPCVD). Thereafter, a laser annealing process such as an excimer laser annealing process is conducted. In the laser annealing process, energy supplied to the excimer laser is carefully controlled such that the amorphous silicon 606 outside the trenches 604 region melts almost completely while the amorphous silicon 606 at the bottom of the trenches 604 melts only partially. Therefore, silicon in the liquid state crystallizes to form a polysilicon layer 608 starting from the bottom of the trenches 604. Furthermore, the polysilicon layer 608 formed by the laser annealing process includes a plurality of crystal boundaries 610. However, these crystal boundaries are located between each pair of neighboring trenches 604 only.

Figure 7A:
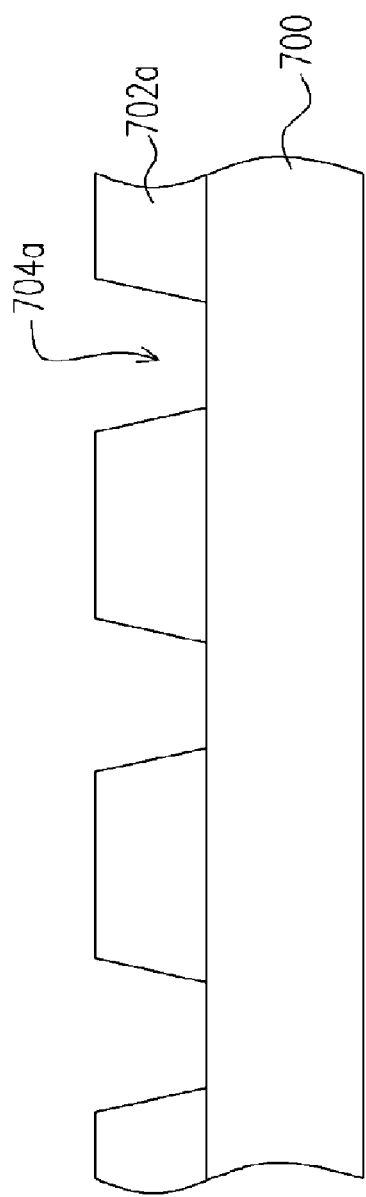

FIGS. 7A to 7D are schematic cross-sectional view showing the progression of steps for fabricating a polysilicon layer according to a second preferred embodiment of this invention. As shown in FIG. 7A, a substrate 700 such as a glass panel is provided. Thereafter, a silicon nitride layer 702a is formed over the substrate 700. The silicon nitride layer 702a is formed, for example, in a plasma-enhanced chemical vapor deposition (PECVD). A plurality of parallel trenches 704a is formed in the silicon nitride layer 702a. The parallel trenches 704a are formed, for example, by conducting photolithographic and etching processes.

Figure 7B:
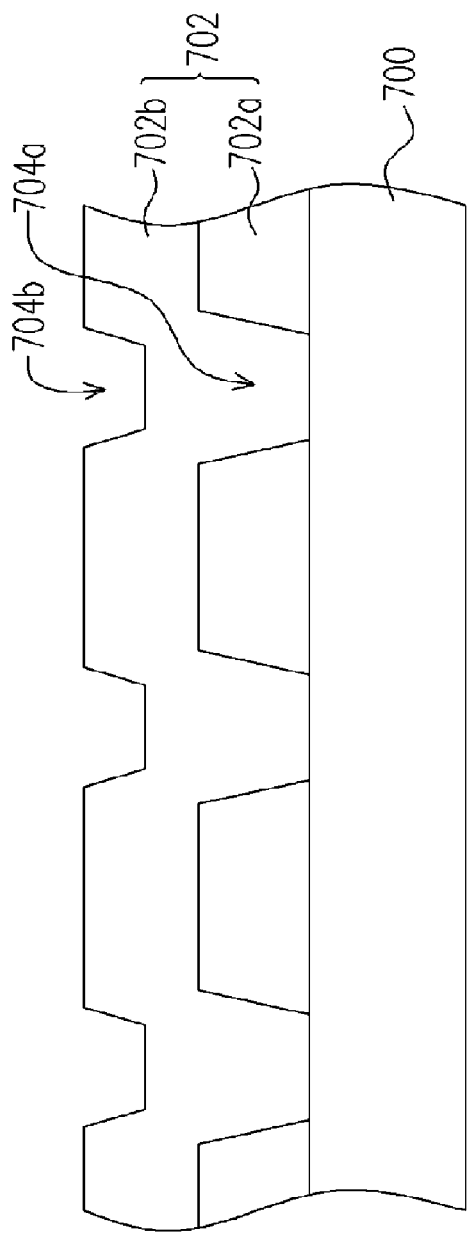

As shown in FIG. 7B, a conformal silicon oxide layer 702b is formed over the silicon nitride layer 702a. The silicon nitride layer 702a and the silicon oxide layer 702b together constitute a buffer layer 702. Since the silicon oxide layer 702b covers the silicon nitride layer 702a, a plurality of trenches 704b are formed over the respective trenches 704a. In addition, width of the trenches 704b is smaller than width of the trenches 704a due to step coverage. Hence, this embodiment is capable of fabricating trenches 704b whose width is smaller than the critical dimension (CD).

As shown in FIGS. 7C and 7D, an amorphous silicon layer 706 is formed over the buffer layer 702. The amorphous silicon layer 706 is formed, for example, in a low-pressure chemical vapor deposition (LPCVD). Thereafter, a laser annealing process such as an excimer laser annealing process is conducted. In the laser annealing process, energy supplied to the excimer laser is carefully controlled such that the amorphous silicon 706 outside the trenches 704b region melts almost completely while the amorphous silicon 706 at the bottom of the trenches 704b melts only partially. Therefore, silicon in the liquid state crystallizes to form a polysilicon layer 708 starting from the bottom of the trenches 704b. Furthermore, the polysilicon layer 708 formed by the laser annealing process includes a plurality of crystal boundaries 710. However, these crystal boundaries are located between each pair of neighboring trenches 704b only.

Figure 8A:
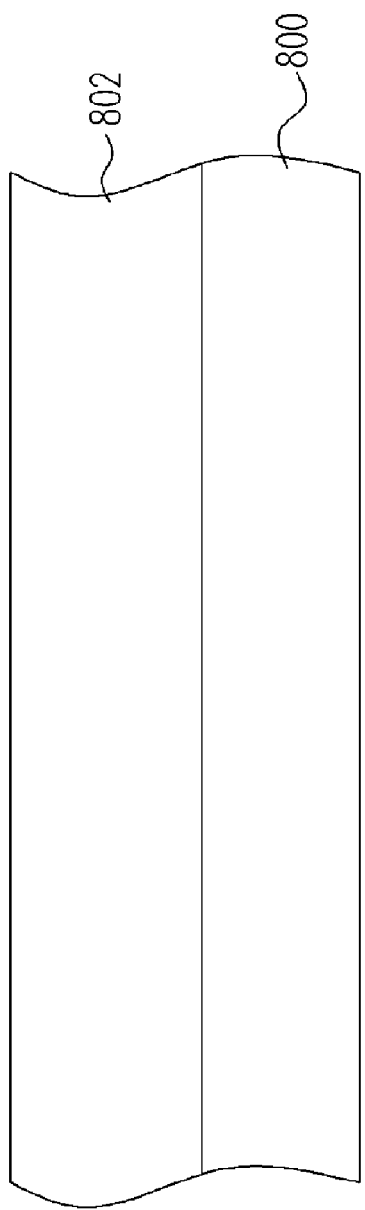

FIGS. 8A to 8D are schematic cross-sectional view showing the progression of steps for fabricating a polysilicon layer according to a third preferred embodiment of this invention. As shown in FIG. 8A, a substrate 800 such as a glass panel is provided. Thereafter, a buffer layer 802 is formed over the substrate 800. The buffer layer can be, for example, a single layer of a low-k material or a composite layer of low-k materials. The low-k material can be an inorganic low-k material or an organic low-k material. If the buffer layer is made of an organic low-k material, a barrier layer may be further included and formed between the buffer layer and the subsequently formed silicon layer.

Figure 8B:
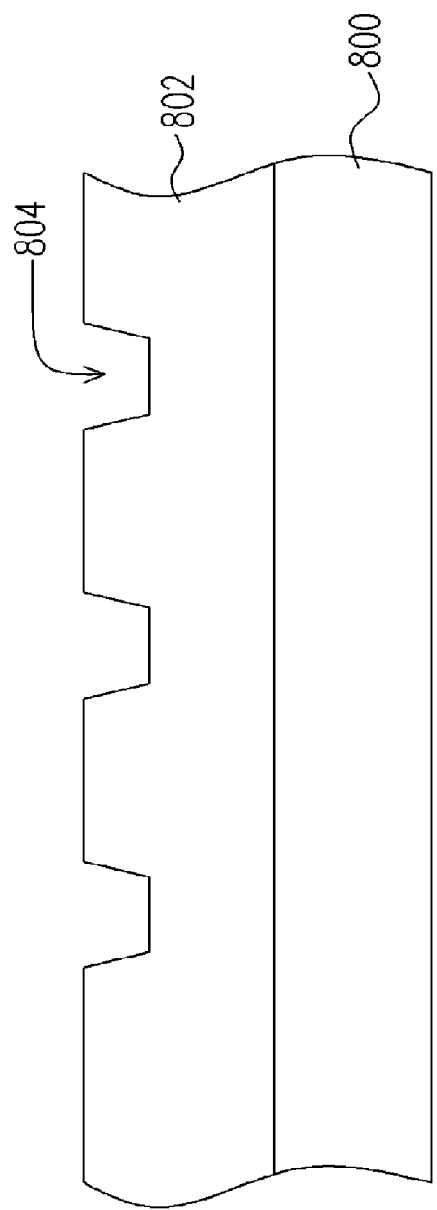

As shown in FIG. 8B, a plurality of parallel trenches 804 is formed in the buffer layer 802. The trenches 804 are formed, for example, by conducting photolithographic and etching processes. If the buffer layer 802 is a composite layer including a first low-k material layer 802a and a second low-k material layer 802b, the trenches 804 can be formed in the upper second low-k material layer 802b, as shown in FIG. 8B'. Alternatively, first trenches 804a can be formed in the lower first low-k material layer 802a, for example, by conducting photolithographic and etching processes, and the later formed second low-k material layer 802b covering the first low-k material layer 802a consequently includes a plurality of second trenches 804b corresponding to the first trenches 804a, as shown in FIG. 8B".

As shown in FIGS. 8C and 8D, an amorphous silicon layer 806 is formed over the buffer layer 802. The amorphous silicon layer 806 is formed, for example, in a low-pressure chemical vapor deposition (LPCVD). Thereafter, a laser annealing process such as an excimer laser annealing process is conducted. In the laser annealing process, energy supplied to the excimer laser is carefully controlled such that the amorphous silicon 806 outside the trenches 804 region melts almost completely while the amorphous silicon 806 at the bottom of the trenches 804 melts only partially. Therefore, silicon in the liquid state crystallizes to form a polysilicon layer 808 starting from the bottom of the trenches 804. Furthermore, the polysilicon layer 808 formed by the laser annealing process includes a plurality of crystal boundaries 810. However, these crystal boundaries are located between each pair of neighboring trenches 804 only.

In conclusion, the method of fabricating a polysilicon layer according to this invention at least includes the following advantages:

1. The partially melted amorphous silicon material at the bottom of trenches provides an ideal side for the initialization of crystallization. Hence, the crystals within the polysilicon layer are more uniformly distributed and have a larger crystal size.

2. Since the trenches are produced in conventional photolithographic and etching processes, no particular equipment is required.

3. Because the partially melted amorphous silicon material inside the trenches provides seeds for lateral crystallization, processing window of the excimer laser annealing process is enlarged.

4. Since the trenches provide seeds for continuous crystallization, the ultimately formed polysilicon layer has fewer grain boundaries.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a polysilicon layer, comprising:
providing a substrate;
forming a first low-k material layer over the substrate;
forming a first set of trenches in the first low-k material layer;
forming an amorphous silicon layer over the first low-k material layer without contacting the substrate; and
conducting a laser annealing process to crystallize the amorphous silicon layer into a polysilicon layer, wherein the polysilicon layer includes a plurality of crystal boundaries and the crystal boundaries are located outside the trenches and between each pair of neighboring trenches.

2. The method of claim 1, wherein the step of forming the amorphous silicon layer comprises filling in the first set of trenches with amorphous silicon.

3. The method of claim 1, further comprising:
forming a second low-k material layer on the first low-k material layer, wherein the second low-k material layer fills in the first set of trenches; and forming a second set of trenches in the second low-k material layer, wherein the amorphous silicon layer fills in the second set of trenches.

4. The method of claim 3, wherein the step of forming the second set of trenches comprises performing photolithographic and etching processes.

5. The method of claim 3, wherein a material of the second low-k material layer is different from that of the first low-k material layer.

6. The method of claim 1, wherein the step of fanning the first set of trenches comprises performing photolithographic and etching processes.

7. The method of claim 1, wherein the step of conducting the laser annealing process comprises an excimer laser annealing process.

8. The method of claim 1, wherein the first set of trenches is substantially parallel to one another.

9. The method of claim 1, wherein the first low-k material layer is comprised of an organic low-k material.

10. The method of claim 1, wherein the first low-k material layer is comprised of an inorganic low-k material.

* * * * *